(12) United States Patent
Liu et al.

(10) Patent No.: US 11,927,853 B2
(45) Date of Patent: Mar. 12, 2024

(54) DISPLAY SUBSTRATE, DISPLAY PANEL AND DISPLAY DEVICE

(71) Applicants: Hefei BOE Display Technology Co., Ltd., Anhui (CN); BOE Technology Group Co., Ltd., Beijing (CN)

(72) Inventors: Yunfei Liu, Beijing (CN); Wei Zhang, Beijing (CN); Jilei Gao, Beijing (CN); Bin Li, Beijing (CN); Benzhi Xu, Beijing (CN); Chao Li, Beijing (CN); Lu Niu, Beijing (CN); Qi Liu, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 597 days.

(21) Appl. No.: 17/259,911

(22) PCT Filed: Apr. 3, 2020

(86) PCT No.: PCT/CN2020/083323
§ 371 (c)(1),
(2) Date: Jan. 12, 2021

(87) PCT Pub. No.: WO2021/196215
PCT Pub. Date: Oct. 7, 2021

(65) Prior Publication Data
US 2022/0137445 A1    May 5, 2022

(51) Int. Cl.
*G02F 1/1343*    (2006.01)
*G02F 1/1362*    (2006.01)
(Continued)

(52) U.S. Cl.
CPC .... *G02F 1/13439* (2013.01); *G02F 1/134345* (2021.01); *G02F 1/136286* (2013.01); *G02F 1/1368* (2013.01); *H01L 27/124* (2013.01)

(58) Field of Classification Search
CPC .................................... G02F 1/134309–13439
See application file for complete search history.

(56) References Cited

U.S. PATENT DOCUMENTS 7,345,728 B2 * 3/2008 Lee .................... G02F 1/133512
349/141
7,705,948 B2 * 4/2010 Segawa ............. G02F 1/133707
349/141
(Continued)

FOREIGN PATENT DOCUMENTS

CN    101144951 A    3/2008
CN    101144951 A    3/2008
(Continued)

OTHER PUBLICATIONS

International Written Opinion issued in PCT/CN2020/083323, dated Dec. 31, 2020, 2 pages.
(Continued)

*Primary Examiner* — Mariceli Santiago
(74) *Attorney, Agent, or Firm* — Arch & Lake LLP

(57) ABSTRACT

The embodiments of the present disclosure relate to the field of display technology, and in particular to a display substrate, a display panel, and a display device. The display substrate includes a first electrode, a first wire, and a second wire; the first electrode is provided with a plurality of slits; the first wire is provided on a side of the first electrode, and a first gap is provided between the first wire and the first electrode, and the first wire being electrically connected to the first electrode; a second wire provided on a side of the first electrode away from the first wire, and a second gap being provided between the second wire and the first elec-
(Continued)

trode; wherein each of the slits is provided with a first end and a second end opposed to each other, and the first end is close to the first wire, and the second end is close to the second wire, and a light-transmitting part of the first end is larger than a light-transmitting part of the second end. The electric field disorder of the first end is better than the electric field disorder of the second, so that the weak zone at the first end is larger than the weak zone at the second end. By increasing the light-transmitting part of the first end, the weak zone at the first end becomes smaller, thereby making the weak zone of the first end is basically the same as the weak zone of the second end.

12 Claims, 7 Drawing Sheets

(51) Int. Cl.
*G02F 1/1368* (2006.01)
*H01L 27/12* (2006.01)

(56) References Cited

U.S. PATENT DOCUMENTS

| | | | |
|---|---|---|---|
| 8,072,569 B2 | 12/2011 | Kaneko | |
| 2008/0068539 A1 | 3/2008 | Kaneko | |
| 2009/0128727 A1* | 5/2009 | Yata | G02F 1/134363 |
| | | | 349/141 |
| 2019/0302541 A1 | 10/2019 | Shimoshikiryoh | |

FOREIGN PATENT DOCUMENTS

| | | | |
|---|---|---|---|
| CN | 110320711 A | 10/2019 | |
| CN | 110349976 A | 10/2019 | |
| CN | 110349976 A | 10/2019 | |
| JP | 2009186870 A * | 8/2009 | G02F 1/134363 |
| JP | 2019174629 A | 10/2019 | |

OTHER PUBLICATIONS

International Search Report issued in PCT/CN2020/083323, dated Dec. 31, 2020, (9p).

* cited by examiner

DISPLAY SUBSTRATE, DISPLAY PANEL AND DISPLAY DEVICE

TECHNICAL FIELD

The embodiments of the present disclosure relate to the field of display technology, and in particular to a display substrate, a display panel including the display substrate, and a display device including the display panel.

BACKGROUND

In the TV market, people's pursuit of TV definition has never stopped. The resolution of 8K TV can reach a pixel size of 7680×4320, that is, there are 7680 effective pixels in the horizontal direction and 4320 effective pixels in the vertical direction, such that its definition is 16 times that of the Blue-ray version. The color depth of 8K TV is 12 bits and the scanning rate can reach 120 frames per second. With the continuous popularization of 5G, large-size 8K ultra-high-definition will become one of the important applications in the 5G era, such as in the medical field, display field, and live broadcast of event performances. With the increase in resolution, the picture quality of the display also needs to be improved, and defects in 8K products are also increasing, such as afterimages, horizontal stripes, Trace Mura (traces left shortly by a finger press) and so on. In the 8K pixel design, due to the disordered electric field at a corner (end) of the pixel electrode Slit, the liquid crystal will be disorderly deflected in the disordered field, and a weak zone where the brightness will be very dark would be formed.

Currently, the weak zone on the Data line side of the pixel itself is larger than the weak zone on an adjacent Data line side of the pixel. The difference in the weak zones on both sides will further cause side viewing angle related defects such as Block, OSD afterimage and Trace Mura, which will seriously affect the picture quality and customer satisfaction.

SUMMARY

The embodiments of the present disclosure provide a display substrate, a display panel including the display substrate, and a display device including the display panel, which can achieve symmetry of weak zones.

In an embodiment of the present disclosure, there is provided a display substrate, including:
- a first electrode provided with a plurality of slits;
- a first wire provided on a side of the first electrode, a first gap being provided between the first wire and the first electrode, and the first wire being electrically connected to the first electrode;
- a second wire provided on a side of the first electrode away from the first wire, and a second gap being provided between the second wire and the first electrode;
- wherein each of the slits is provided with a first end and a second end opposed to each other, the first end is close to the first wire, the second end is close to the second wire, and a light-transmitting part of the first end is larger than a light-transmitting part of the second end.

In an embodiment of the present disclosure, each of the slits is formed by connecting a first side, a first side group, a second side and a second side group end to end, the first side and the second side are parallel to each other, the first side is arranged at the first end, and the second side is arranged at the second end.

In an embodiment of the present disclosure, a shape formed by the first side group protrudes toward a side of the first wire, and a shape formed by the second side group protrudes toward a side of the second wire.

In an embodiment of the present disclosure, a number of sub-sides included in the first side group is greater than or equal to a number of sub-sides included in the second side group.

In an embodiment of the present disclosure, the first side group comprises:
- a first sub-side connected to the first side;
- a second sub-side, one end of which is connected to the first sub-side and the other end of which is connected to the second side;

the second side group comprises:
- a fourth sub-side connected to the second side;
- a fifth sub-side, one end of which is connected to the fourth sub-side, and the other end of which is connected to the first side;
- wherein the fourth sub-side is arranged in parallel with the first sub-side, and a length of the fourth sub-side is less than a length of the first sub-side, and a length of the fifth sub-side is greater than a length of the second sub-side; or the fifth sub-side and the second sub-side are arranged in parallel, and the length of the fifth sub-side is less than the length of the second sub-side, and the length of the fourth sub-side is greater than the length of the first sub-side.

In an embodiment of the present disclosure, the first side group comprises:
- a first sub-side connected to the first side;
- a second sub-side, one end of which is connected to the first sub-side and the other end of which is connected to the second side;

the second side group comprises:
- a fourth sub-side connected to the second side;
- a fifth sub-side, one end of which is connected to the fourth sub-side, and the other end of which is connected to the first side;
- wherein a length of the first sub-side is greater than a length of the fourth sub-side, and a length of the second sub-side is greater than a length of the fifth sub-side.

In an embodiment of the present disclosure, the first side group comprises:
- a first sub-side connected to the first side;
- a second sub-side connected to the first sub-side;
- a third sub-side, one end of which is connected to the second sub-side, and the other end of which is connected to the second side;

the second side group comprises:
- a fourth sub-side connected to the second side;
- a fifth sub-side, one end of which is connected to the fourth sub-side, and the other end of which is connected to the first side;
- wherein an included angle between the first sub-side and the first side is greater than an included angle between the fourth sub-side and the second side, and an included angle between the third sub-side and the second side is greater than an included angle between the fifth sub-side and the first side, and a perpendicular distance between at least one point on the second sub-side and a line connecting a first end of the first side and a first end of the second side is equal to a perpendicular distance between an intersection of the fourth sub-side and the fifth sub-side and a line connecting a second end of the first side and a second end of the second side.

In an embodiment of the present disclosure, the first side group is configured as an arc, and the second side group comprises at least two sub-sides, and the radius of the arc is greater than or equal to the radius of a circumcircle of the second side group.

In an embodiment of the present disclosure, in a first area of the first electrode, the slits extend in a first direction; and in a second area of the first electrode, the slits extend in a second direction, and the first direction is not parallel to the second direction.

In an embodiment of the present disclosure, the display substrate further comprises a second electrode, and the second electrode is arranged opposite to the first electrode to form a multi-dimensional electric field.

In an embodiment of the present disclosure, the first electrode is a pixel electrode, and the second electrode is a common electrode.

In an embodiment of the present disclosure, the display substrate further comprises:
- a base substrate on which a plurality of sub-pixels are provided;
- each of the sub-pixels comprising a thin film transistor, a gate line, and a common electrode line, the thin film transistor comprising a source, a drain, and a gate, the source and the drain being provided in the same layer and being made by the same material as the first wire, the source being electrically connected to the first wire, and the drain being electrically connected to the first electrode;
- a gate line, which is provided in the same layer and is made by the same material as the gate, and is electrically connected to the gate;
- a common electrode line provided in the same layer and made by the same material as the gate, and the common electrode line being electrically connected to the second electrode.

In an embodiment of the present disclosure, there is provided a display panel comprising: the above-mentioned display substrate.

In an embodiment of the present disclosure, there is provided a display device comprising: the above-mentioned display panel.

BRIEF DESCRIPTION OF THE DRAWINGS

The accompanying drawings are used to provide a further understanding of the embodiments of the present disclosure, and constitute a part of the specification, and are used to explain the present disclosure together with the embodiments of the present disclosure, and do not constitute a limitation to the present disclosure. The above and other features and advantages will become more apparent to those skilled in the art by describing detailed example embodiments with reference to the accompanying drawings. In the accompanying drawings.

DETAILED DESCRIPTION

Figure 1:
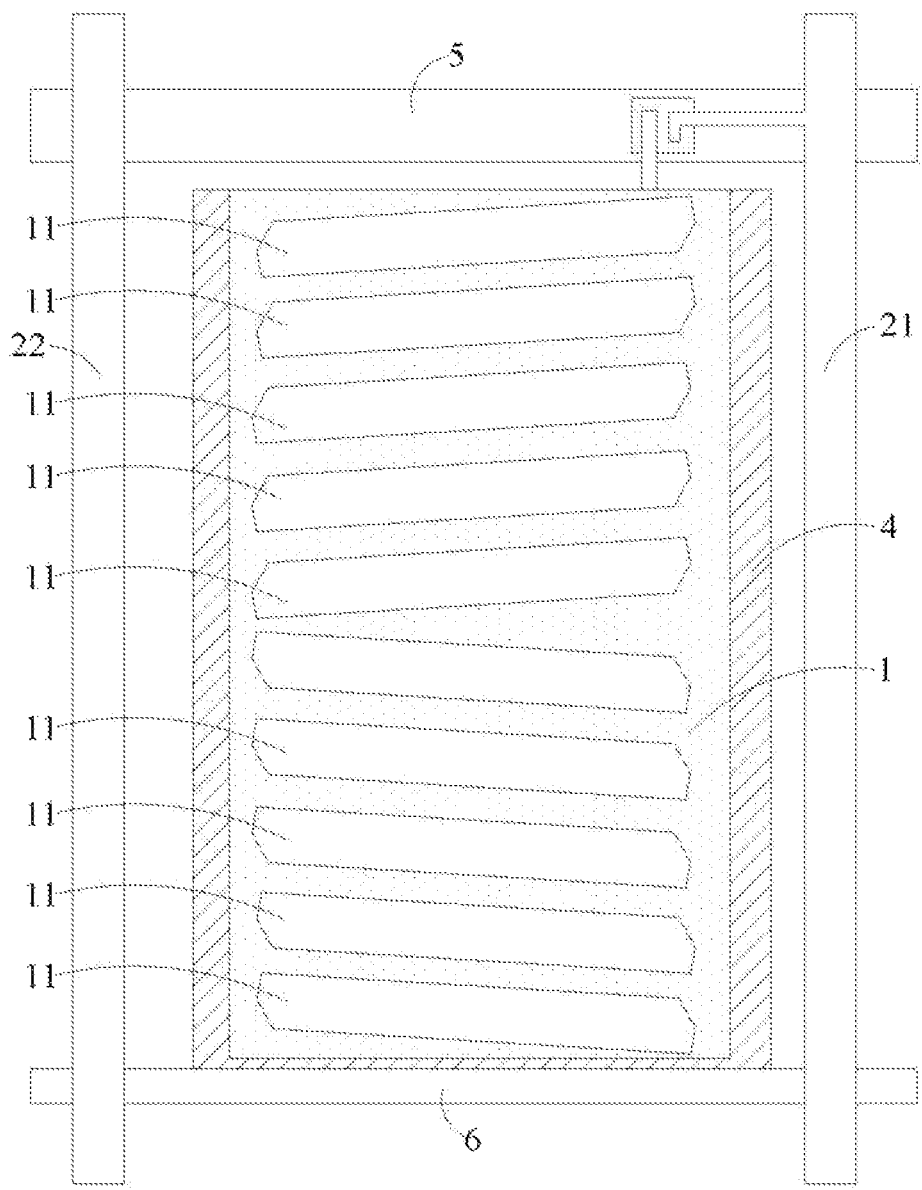
FIG. 1 is a structural schematic diagram of a display panel in the related art.

Example embodiments will now be described more fully with reference to the accompanying drawings. However, the example embodiments can be implemented in various forms, and should not be construed as being limited to the embodiments set forth herein; on the contrary, these embodiments are provided so that the present disclosure will be comprehensive and complete, and fully convey the concept of the example embodiments to those skilled in the art. The same reference numerals in the figures represent the same or similar structures, and thus their detailed descriptions will be omitted.

Although relative terms such as "upper" and "lower" are used in this specification to describe the relative relationship of one component of an icon to another, these terms are used in this specification only for convenience, for example, according to the direction of the example described in the drawings. It can be understood that if the device of the icon is turned over and turned upside down, the component described as "upper" will become the "lower" component. When a structure is "on" another structure, it may mean that a certain structure is integrally formed on another structure, or that a certain structure is "directly" arranged on another structure, or that a certain structure is "indirectly" arranged on other structures through another structure.

The terms "a", "a", "the", "said" and "at least one" are used to indicate the presence of one or more elements/components/etc.; the terms "comprising" and "have" are used to indicate open-ended inclusive means and means that there may be additional elements/components/etc. besides the listed elements/components/etc.

Referring to FIG. 1, which is a schematic structural diagram of a display panel in the related art. The display substrate may include a first electrode 1, a first wire 21 and a second wire 22. The first electrode 1 is provided with a plurality of slits 11; the first wire 21 is provided on a side of the first electrode 1, a gap space is provided between the first wire 21 and the first electrode 1, and the first wire is electrically connected to the first electrode 1. The second wire 22 is provided on a side of the first electrode 1 opposite to the first wire 21, and a gap space is provided between the second wire 22 and the first electrode 1. Each of the slit 11 has a first end and a second end opposite to each other, the first end is close to the first wire 21, the second end is close to the second wire 22, and a light-transmitting portion of the first end is equal to a light-transmitting portion of the second end. Each of the slits 11 is formed by connecting a first side, a first sub-side, a second sub-side, a second side, a third sub-side and a fourth sub-side end to end, the first side and the second side are parallel to each other and have a same length, the first sub-side and the third sub-side are parallel and equal in length, and the second sub-side and the fourth sub-side are parallel and equal in length.

Figure 2:
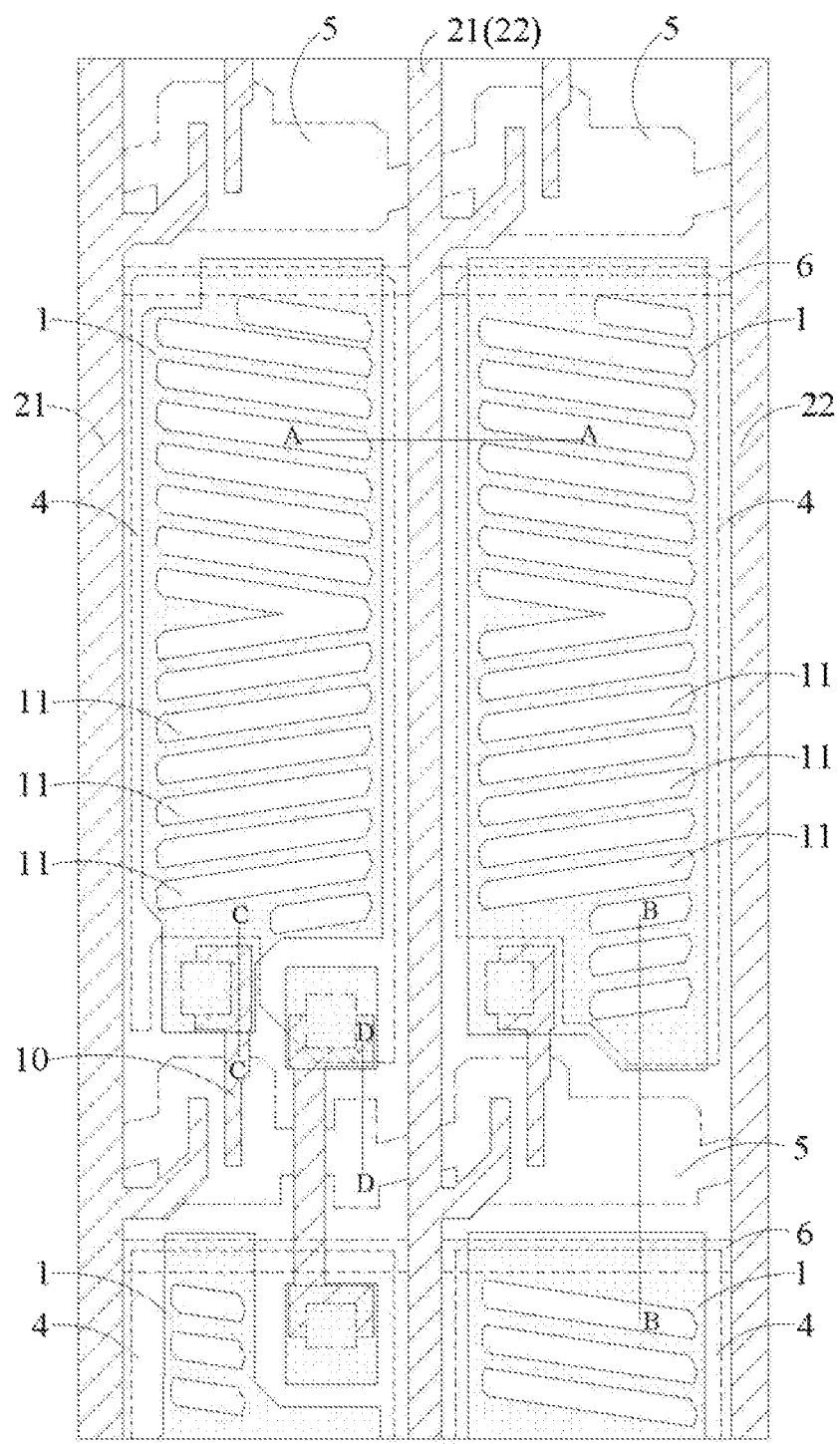
FIG. 2 is a structural schematic diagram of an exemplary embodiment of a display panel of the present disclosure.

The present disclosure first provides a display substrate. Referring to FIG. 2 showing the schematic structural diagram of an exemplary embodiment of the display panel of the present disclosure, the data line in the middle of the figure are marked with 21 and 22. This is because the data line is a data line electrically connected to the adjacent sub-pixel (the sub-pixel on the right) compared with the sub-pixel on the left, the data line is a data line electrically connected to the sub-pixel (the sub-pixel on the right) compared with the sub-pixel on the right. The display substrate may comprise a first electrode 1, a first wire 21, and a second wire 22. The first electrode 1 is provided with a plurality of slits 11; the first wire 21 is provided on a side of the first electrode 1, a first gap is provided between the first wire 21 and the first electrode 1 and the first wire 21 is electrically connected to the first electrode 1; the second wire 22 is provided on a side of the first electrode 1 away from the first wire 21, and a second gap is provided between the second wire 22 and the first electrode 1; wherein each of the slits 11 has a first end and a second end opposite to each other, the first end is close to the first wire 21, the second end is close to the second wire 22, and a light-transmitting part M of the first end is larger than a light-transmitting part N of the second end, so that the size of the weak zone at the first end is the same as the size of the weak zone at the second end when displaying.

It should be noted that for any sub-pixel, the first wire 21 is electrically connected to the first electrode 1 of the sub-pixel, and the second wire 22 is disposed on a side of the first electrode 1 of the sub-pixel away from the first wire 21 and is not electrically connected to the first electrode 1 of the sub-pixel.

Since the influence of the first wire 21 on a liquid crystal layer at the first end of the slits 11 is greater than the influence of the second wire 22 on the liquid crystal layer at the second end of the slits 11, the disturbance of an electric field at the first end is better than that of the second end, so that the weak zone at the first end is larger than the weak zone at the second end. By increasing the light-transmitting part M at the first end, the weak zone at the first end becomes smaller, thereby making the weak zone at the first end basically the same as the weak zone at the second end, avoiding related defects such as Block, OSD afterimage and Trace Mura.

In this exemplary embodiment, the first electrode 1 is a pixel electrode, and the material of the first electrode 1 may be indium tin oxide, which has good conductivity and light transmittance. A plurality of slits 11 are provided on the first electrode 1.

Figure 3:
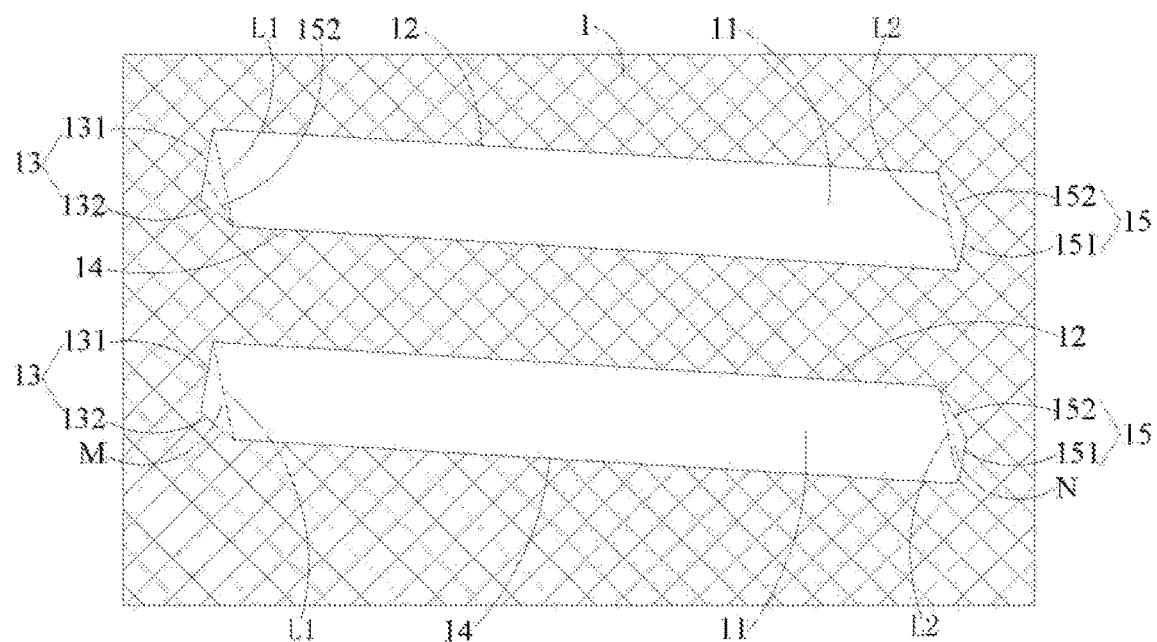
FIG. 3 is a partial enlarged schematic diagram of a first example embodiment of a first electrode.

As shown in FIG. 3, each of the slits 11 is formed by connecting a first side 12, a first side group 13, a second side 14 and a second side group 15 end to end. The first side 12 and the second side 14 are parallel to each other, the first side group 13 is located at the first end, and the first side group 13 is close to the first wire 21. The second side group 15 is located at the second end, and the second side group 15 is close to the second wire 22.

In this exemplary embodiment, an end of the first side 12 at the first end of each of the slits 11 is called a first end of the first side 12, and an end of the first side 12 at the second end of each of the slits 11 is called a second end of the first side 12; an end of the second side 14 at the first end of each of the slits 11 is called a first end of the second side 14, and an end of the second side 14 at the second end of each of the slits 11 is called a second end of the second side 14. A length of the first side 12 is the same as a length of the second side 14, and the first side 12 and the second side 14 are arranged in a staggered manner. Specifically, the first end of the first side 12 protrudes from the first end of the second side 14, and the second end of the second side 14 protrudes from the second end of the first side 12; the first end of the first side 12 is connected to the first end of the second side 14 and the second end of the first side 12 is connected to the second end of the second side 14, which forms a shape of parallelogram. Of course, in other exemplary embodiments of the present disclosure, it is also possible that the first end of the second side 14 protrudes from the first end of the first side 12 and the second end of the first side 12 protrudes from the second end of the second side 14.

In this exemplary embodiment, a shape formed by the first side group 13 protrudes away from the second side group 15, that is, the shape formed by the first side group 13 protrudes toward the first wire 21, that is, protrudes toward a side of the first wire 21. The so-called "protrude" is relative to a line L1 between the first end of the first side 12 and the first end of the second side 14. An area formed by connecting the first side group 13 with the line L1 between the first end of the first side 12 and the first end of the second side 14 is the light-transmitting portion M at the first end. A shape formed by the second side group 15 protrudes away from the first side group 13, that is, the shape formed by the second side group 15 protrudes toward the second wire 22, that is, protrudes toward the side of the second wire 22. The so-called "protrude" is relative to a line L2 between the second end of the first side 12 and the second end of the second side 14. An area formed by connecting the second side group 15 with the line L2 between the second end of the first side 12 and the second end of the second side 14 is the light-transmitting portion N at the second end. The number of sub-sides included in the first side group 13 may be equal to the number of sub-sides included in the second side group 15.

In this exemplary embodiment, the first side group 13 may include a first sub-side 131 and a second sub-side 132. Specifically, the first sub-side 131 is connected to the first side 12, and an included angle between the first sub-side 131 and the first side 12 is an obtuse angle. One end of the second sub-side 132 is connected to the first sub-side 131, the other end of the second sub-side 132 is connected to the second side 14, and an included angle between the second sub-side 132 and the second side 14 is also an obtuse angle. Of course, the included angle between the first sub-side 131 and the first side 12 may be a right angle, which can also ensure that a shape formed by the first side group 13 protrudes away from the second side group 15.

The second side group 15 may include a fourth sub-side 151 and a fifth sub-side 152. Specifically, the fourth sub-side 151 is connected to the second side 14, and an included angle between the fourth sub-side 151 and the second side 14 is an obtuse angle. One end of the fifth sub-side 152 is connected to the fourth sub-side 151, the other end of the fifth sub-side 152 is connected to the first side 12, and an included angle between the fifth sub-side 152 and the first side 12 is also an obtuse angle. Of course, the angle between the fourth sub-side 151 and the second side 14 can be a right angle, and it can also ensure that a shape formed by the second side group 15 protrudes away from the first side group 13.

Figure 4:
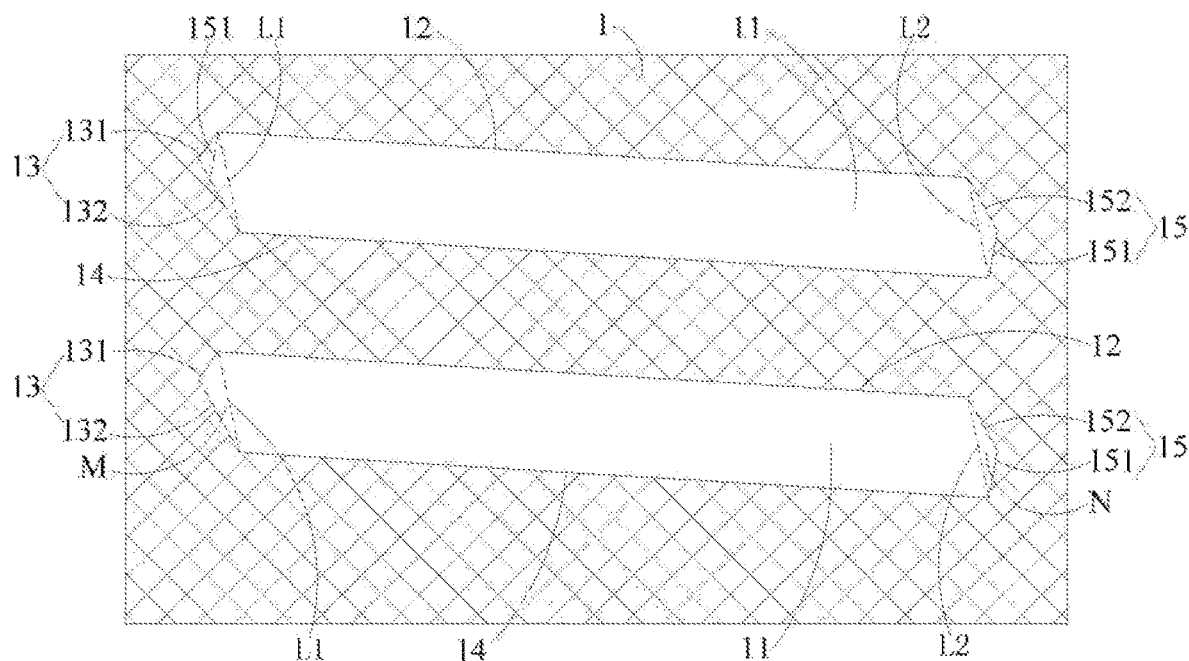
FIG. 4 is a partial enlarged schematic diagram of a second example embodiment of the first electrode.

The fourth sub-side 151 is arranged parallel to the first sub-side 131, and a length of the fourth sub-side 151 is less than a length of the first sub-side 131. In FIG. 3, the fifth sub-side 152 is drawn and marked at the first end by a dotted line for comparison, which is for better understanding rather than real existence, and a length of the fifth sub-side 152 is greater than a length of the second sub-side 132. An area formed by connecting the first sub-side 131 and the second sub-side 132 with the line L1 between the first end of the first side 12 and the first end of the second side 14 is the light-transmitting part M of the first end, and an area formed by connecting the fourth sub-side 151 and the fifth sub-side 152 with the line L2 between the second end of the first side 12 and the second end of the second side 14 is the light-transmitting portion N at the second end, and the light-transmitting portion M at the first end is larger than the light-transmitting portion N at the second end, reducing the size of the weak zone at the first end by the structural design. Of course, referring to FIG. 4, the fourth sub-side 151 is drawn and marked at the first end by a dotted line for comparison, which is for better understanding rather than actual existence. It may also be that the fifth sub-side 152 and the second sub-side 132 are arranged in parallel, the length of the fifth sub-side 152 is less than the length of the second sub-side 132, and the length of the fourth sub-side 151 is greater than the length of the first sub-side 131.

Figure 5:
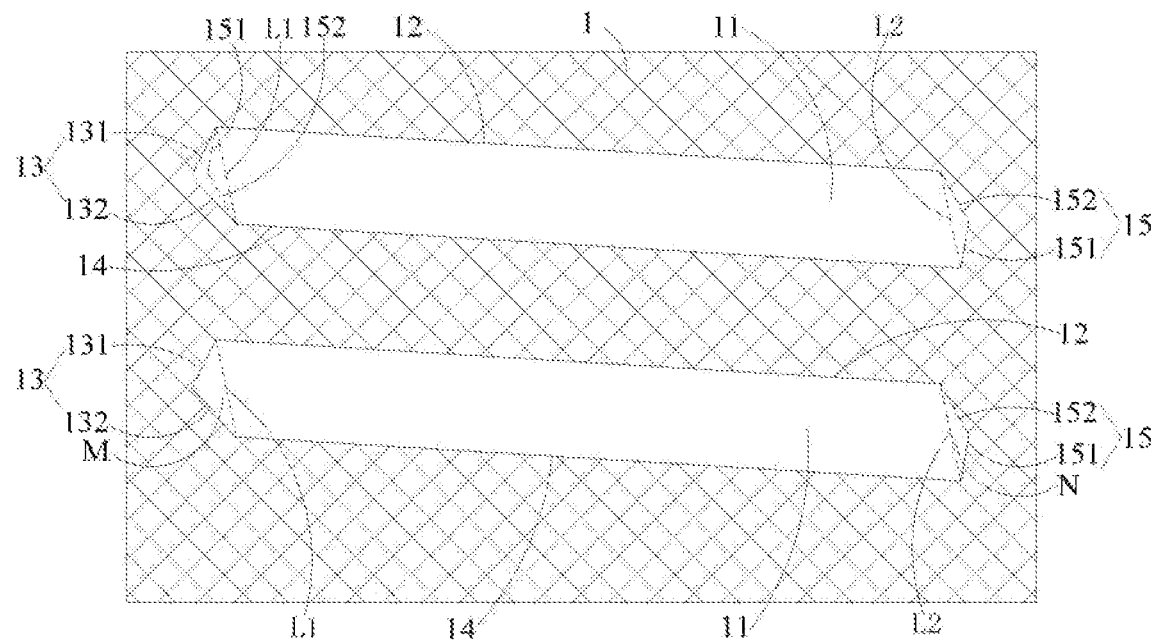
FIG. 5 is a partial enlarged schematic diagram of a third example embodiment of the first electrode.

Referring to FIG. 5, it can also be configured that the length of the first sub-side 131 is greater than the length of the fourth sub-side 151, and the length of the second sub-side 132 is greater than the length of the fifth sub-side 152, so that an included angle of the first sub-side 131 and the second sub-side 132 is smaller than an included angle of the fourth sub-side 151 and the fifth sub-side 152. It is also possible to make the light-transmitting portion M at the first end of each of the slits 11 larger than the light-transmitting portion N at the second end of each of the slits 11 to reduce the size of the weak zone at the first end by the structural design.

Figure 6:
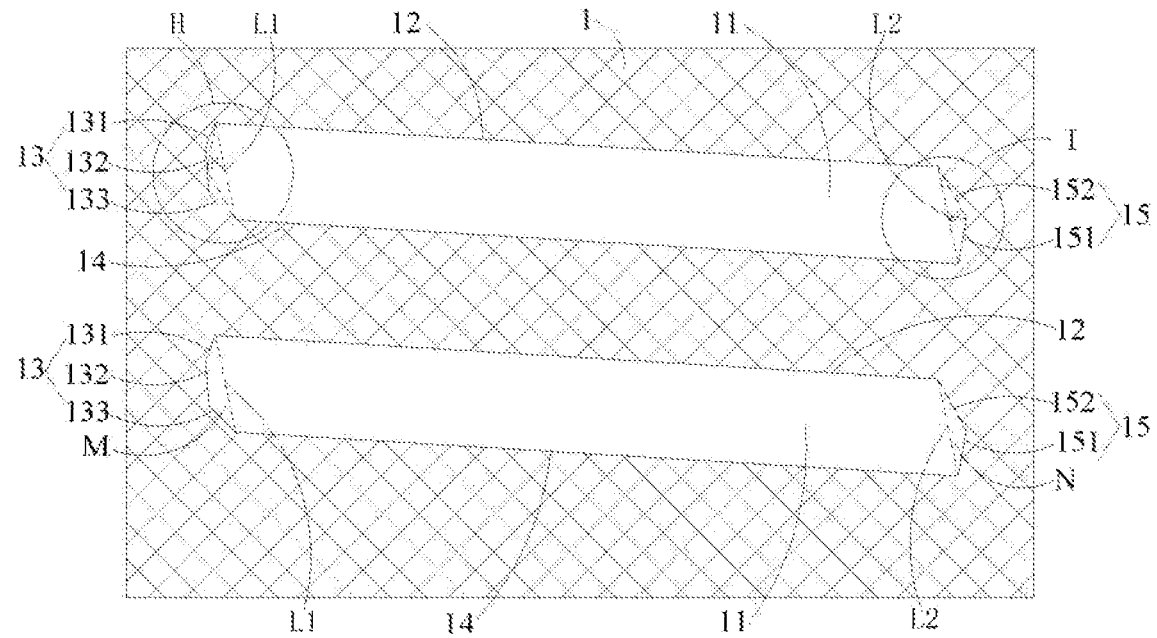
FIG. 6 is a partial enlarged schematic diagram of the first electrode in FIG. 2.
Figure 7:
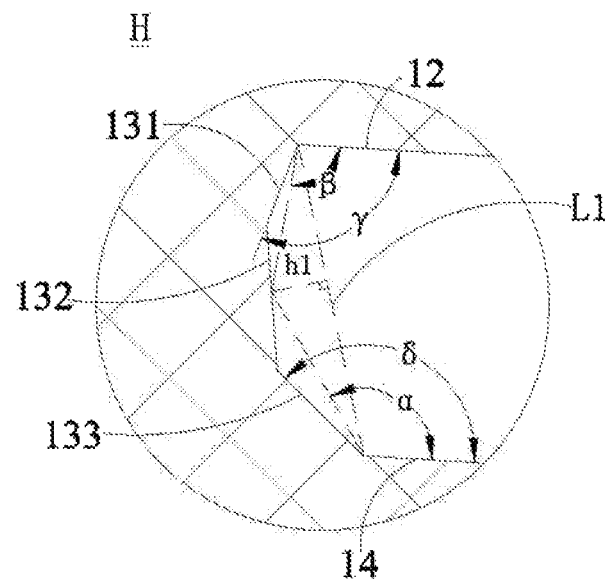
FIG. 7 is a partial enlarged schematic diagram of the part indicated by H in FIG. 6.
Figure 8:
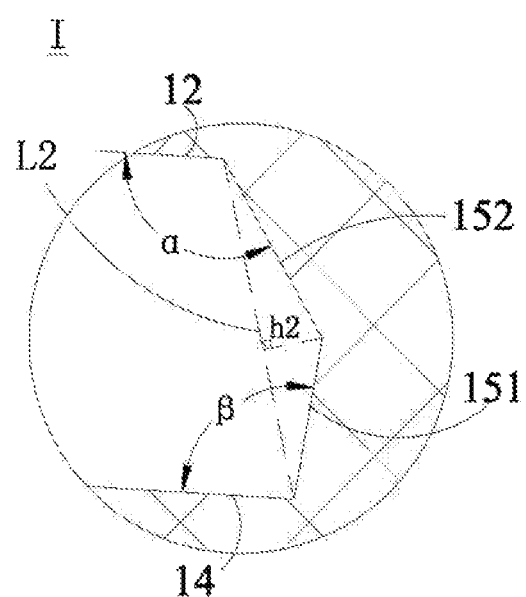
FIG. 8 is a partial enlarged schematic diagram of the part indicated by I in FIG. 6.

In addition, in other exemplary embodiments of the present disclosure, the structures of the first side group 13 and the second side group 15 are not limited to the above description. For example, the number of sub-sides of the first side group 13 may be greater than the number of sub-sides of the second side group 15. Referring to FIG. 6, specifically, the first side group 13 may include a first sub-side 131, a second sub-side 132, and a third sub-side 133. The first sub-side 131 is connected to the first edge 12, and the included angle between the first sub-side 131 and the first side 12 is an obtuse angle; the second sub-side 132 is connected to the first sub-side 131, and the included angle between the second sub-side 132 and the first sub-side 131 is also an obtuse angle; one end of the third sub-side 133 is connected to the second sub-side 132, the included angle between the third sub-side 133 and the second sub-side 132 is also an obtuse angle; the other end of the third sub-side 133 is connected to the second side 14, and the included angle between the third sub-side 133 the second side 14 is also an obtuse angle. The second side group 15 may include a fourth sub-side 151 and a fifth sub-side 152; the fourth sub-side 151 is connected to the second side 14, and the included angle between the fourth sub-side 151 and the second side 14 is an obtuse angle; one end of the side 152 is connected to the fourth sub-side 151, and the included angle between the fifth sub-side 152 and the fourth sub-side 151 is also an obtuse angle; the other end of the fifth sub-side 152 is connected to the first side 12, and the included angle between the fifth sub-side 152 and the first side 12 is also an obtuse angle. Referring to FIGS. 7 and 8, for comparison and ease of understanding, a design line with the same structure as the second end is drawn through a dashed line at the first end; an included angle γ between the first sub-side 131 and the first side 12 is greater than an included angle β between the fourth sub-side 151 and the second side 14 and an included angle δ between the third sub-side 133 and the second side 14 is greater than an included angle α between the fifth sub-side 152 and the first side 12, and it is also needed that a perpendicular distance h1 between at least one point on second sub-side 132 and the line L1 between the first end of the first side 12 and the first end of the second side 14 is equal to a perpendicular distance h2 between an intersection of the fourth sub-side 151 and the fifth sub-side 152 and the line L2 between the second end of the first side 12 and the second end of the second side 14. An area formed by connecting the first sub-side 131, the second sub-side 132 and the third sub-side 133 with the line L1 between the first end of the first side 12 and the first end of the second side 14 is the light-transmitting part M of the first end. An area formed by connecting the fourth sub-side 151 and the fifth sub-side 152 with the line L2 between the second end of the first side 12 and the second end of the second side 14 is the light-transmitting portion N at the second end. It is also possible to make the light-transmitting portion M at the first end of each of the slits 11 larger than the light-transmitting portion N at the second end of each of the slits 11 to reduce the size of the weak zone at the first end by the structural design.

Figure 9:
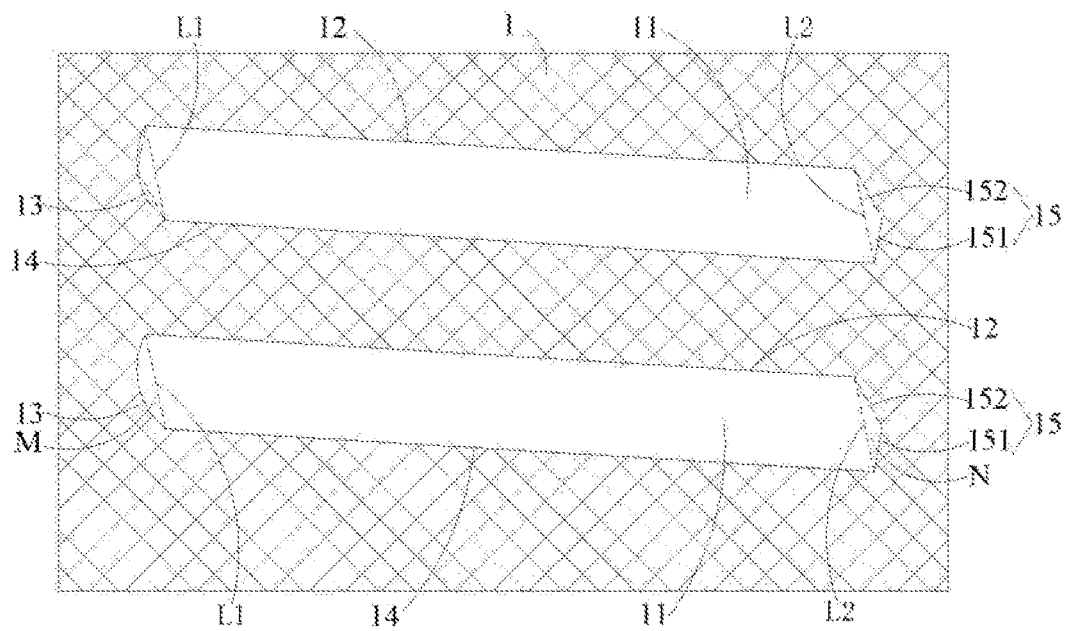
FIG. 9 is a partial enlarged schematic diagram of a fourth example embodiment of the first electrode.

Also, referring to FIG. 9, for comparison and easy understanding, the design line with the same structure as the second end is drawn through a dotted line at the first end; the first side group 13 can also be set as an arc, and the second side group 15 may include at least two sub-sides, and the radius of the arc is greater than or equal to the radius of the circumcircle of the second side group 15. An area formed by connecting the arc and the line L1 between the first end of the first side 12 and the first end of the second side 14 is the light-transmitting part M of the first end, and an area formed by connecting the fourth sub-side 151 and the fifth sub-side 152 with the line L2 between the second end of the first side 12 and the second end of the second side 14 is the light-transmitting part N of the second end. Therefore, the above-mentioned structure can also make the light-transmitting part M of the first end of each of the slits 11 larger than the light-transmitting part N at the second end of each of the slits 11, which reduces the size of the weak zone at the first end by the structural design. Of course, the second side group 15 can also be set as an arc, as long as the radius of the arc of the first side group 13 is greater than the radius of the arc of the second side group 15.

In this exemplary embodiment, the first electrode 1 is provided with two areas, namely a first area and a second area, and the first area and the second area are arranged along the length direction of the first wire 21. In the first area, the slits 11 extend in the first direction; in the second area, the slits 11 extend in the second direction, and the first direction and the second direction are not parallel. Due to the different extension directions of the slit 11 of electrodes of the slits 11, after power-on, the orientations of the liquid crystals in the first area and the second area of the pixel are not consistent, forming a dual-domain. Dual-domain and multi-domain pixels can solve the problem of improving the narrow viewing angle.

In this exemplary embodiment, the first wire 21 is a first data line, and the first data line is connected to the first electrode 1 of the pixel. The second wire 22 is a second data line, and the second wire 22 is connected to the first electrode 1 of an adjacent pixel.

In this exemplary embodiment, a plurality of sub-pixels may be provided in the display area of a base substrate 9.

Each of the sub-pixels may include a first data line, a common electrode line 6, a gate line 5, a thin film transistor, a first electrode 1 and a second electrode 4. The thin film transistor includes a source, a drain 10, and a gate. The drain 10 is electrically connected to the first electrode 1, and the source and the first data line are formed by a same patterning process and connected as a whole. The common electrode line 6, the gate and the gate line 5 are formed by a same patterning process and connected as a whole. The second electrode 4 is electrically connected to the common electrode line 6.

Figure 10:
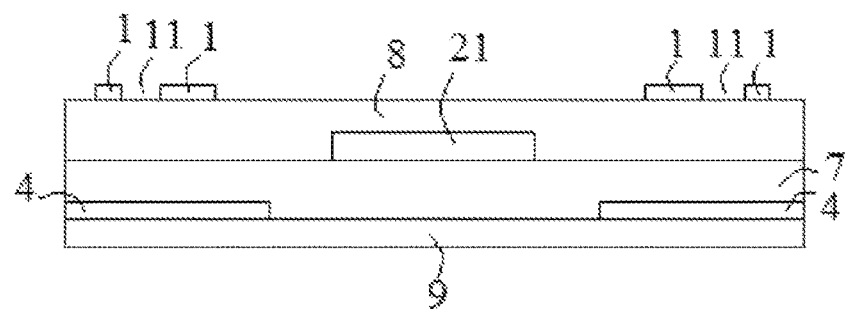
FIG. 10 is a schematic cross-sectional view at line A-A in FIG. 2.

Referring to FIG. 10 showing the schematic cross-sectional view at line A-A in FIG. 2, second electrodes 4 are provided on the base substrate 9. In the figure, two second electrodes 4 are a second electrode 4 of the pixel and a second electrode 4 of an adjacent pixel, and the second electrodes 4 are common electrodes; on a side of the second electrodes 4 away from the base substrate 9, a gate insulating layer 7 is provided, and the first data line (first wire 21) is provided at on a side of the gate insulating layer 7 away from the base substrate 9, and a passivation layer 8 is provided on a side of the first data line away from the base substrate 9, and the first electrode 1 is provided on a side of the passivation layer 8 away from the base substrate 9. Two parts of the first electrode 1 in the figure are a first electrode 1 of the pixel and a first electrode 1 of an adjacent pixel, and the first electrode 1 is the pixel electrode, and the second electrode 4 is provided opposite to the first electrode 1, to form a multi-dimensional electric field. An orthographic projection of the first data line on the base substrate 9 and orthographic projections of the first electrode 1 and the second electrode 4 on the base substrate 9 do not overlap each other. The first data line is located between two adjacent sub-pixels in a row direction.

Figure 11:
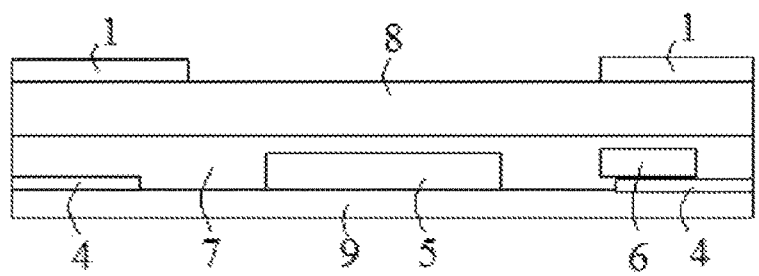
FIG. 11 is a schematic cross-sectional view at line B-B in FIG. 2.

Referring to FIG. 11 showing the schematic cross-sectional view at line B-B in FIG. 2, a gate line 5 is also provided on the base substrate 9. A thickness of the gate line 5 is greater than that of the second electrode 4; a side of the second electrode 4 away from the base substrate 9 is provided with a common electrode line 6, so that the second electrode 4 is conductively connected to the common electrode line 6, and the second electrode 4 is provided with electrical signals through the common electrode line 6. The gate insulating layer 7 is provided on a side of the common electrode line 6 away from the base substrate 9, and the passivation layer 8 is provided on the side of the gate insulating layer 7 away from the base substrate 9, and the first electrode 1 is provided on the side of the passivation layer 8 away from the base substrate 9, two parts of the first electrode 1 in the figure are a first electrode 1 of the pixel and a first electrode 1 of an adjacent pixel. An orthographic projection of the gate line 5 on the base substrate 9 and orthographic projections of the first electrode 1 and the second electrode 4 on the base substrate 9 do not overlap each other. The gate line 5 is located between two adjacent sub-pixels in a column direction.

Figure 12:
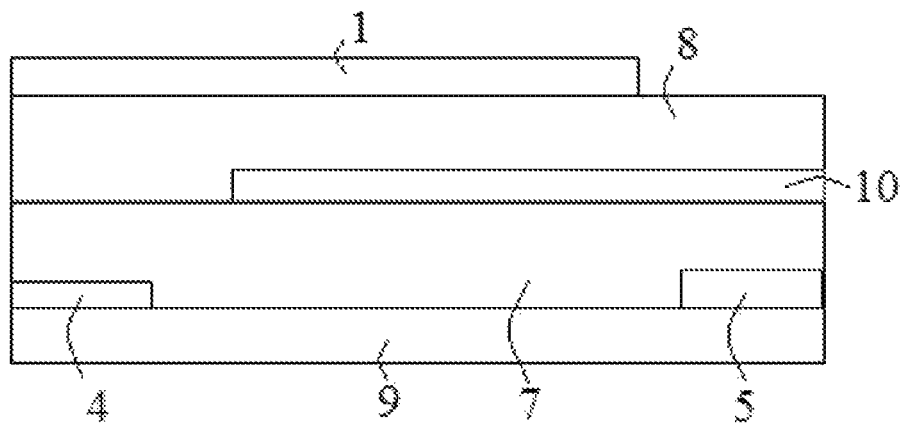
FIG. 12 is a schematic cross-sectional view at line C-C in FIG. 2.

Referring to FIG. 12 showing the schematic cross-sectional view at the C-C line in FIG. 2, the second electrode 4 and the gate line 5 are arranged on the base substrate 9. The thickness of the gate line 5 is greater than a thickness of the second electrode 4; the gate insulating layer 7 is provided on a side of the second electrode 4 and the gate line 5 away from the base substrate 9, and the drain 10 is provided on the side of the gate insulating layer 7 away from the base substrate 9. the drain 10, the first data line (first wire 21) and a second data line are provided in a same layer and material, that is, the drain 10 is formed with the first data line (first wire 21) and the second data line through a same patterning process. The passivation layer 8 is provided on a side of the drain 10 away from the base substrate 9. The first electrode 1 is provided on the side of the passivation layer 8 away from the base substrate 9, and the first electrode 1 is conductively connected to the drain 10 through a via hole.

Figure 13:
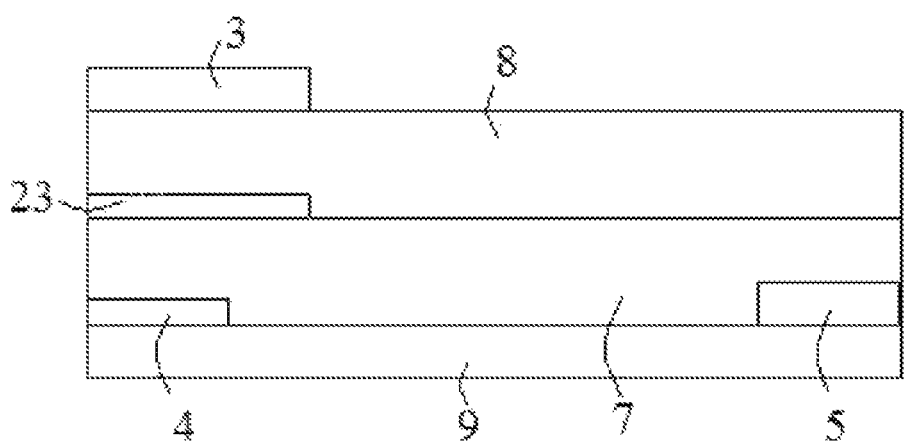
FIG. 13 is a schematic cross-sectional view at line D-D in FIG. 2.

Referring to FIG. 13 showing the schematic cross-sectional view at line D-D in FIG. 2, the second electrode 4 and the gate line 5 are arranged on the base substrate 9. The thickness of the gate line 5 is greater than the thickness of the second electrode 4; the gate insulating layer 7 is provided on the side of the second electrode 4 and the gate line 5 away from the base substrate 9, and a connecting data line 23 is provided on the side of the gate insulating layer 7 away from the base substrate 9, and the connecting data line 23, the first data line and the second data line are formed by one patterning process; the passivation layer 8 is provided on a side of the connecting data line 23 that is away from the base substrate 9, and a conductive layer 3 is provided on a side of the passivation layer 8 is away from the base substrate 9, and the conductive layer 3 and the first electrode 1 are formed by the same one patterning process. The gate insulating layer 7, the connecting data line 23 and the passivation layer 8 are penetrated by a via hole. The conductive layer 3 is connected to the connecting data line 23 by the via hole in the passivation layer 8, and the conductive layer 3 is connected to the second electrode 4 by the via hole in the connecting data line 23 and the via hole in the gate insulating layer 7, so that the second electrode 4 is conductively connected to the connecting data line 23 through the conductive layer 3, thereby connecting the second electrodes 4 of adjacent pixels.

Further, the present disclosure also provides a display panel, which comprises the above-mentioned display substrate. The specific structure of the display substrate has been described in detail above, so it is not repeated here.

Compared with the prior art, the beneficial effects of the display panel provided by the embodiments of the present disclosure are the same as the beneficial effects of the display substrate provided by the above-mentioned embodiments, and will not be repeated here.

Further, the present disclosure also provides a display device, which comprises the above-mentioned display panel. The specific type of the display device is not particularly limited. The types of display devices commonly used in the field can be used, such as mobile devices such as mobile phones, wearable devices such as watches, VR devices, displays, etc. The specific purpose of the display device is selected accordingly, which will not be repeated here.

It should be noted that, in addition to the display panel, the display device also includes other necessary components and members. Taking the display as an example, specific examples include a housing, a circuit board, a power cord, etc. The specific usage requirements shall be supplemented accordingly, and will not be repeated here.

Compared with the prior art, the beneficial effects of the display device provided by the embodiments of the present disclosure are the same as the beneficial effects of the display substrate provided by the above-mentioned embodiments, and will not be repeated here. Those skilled in the art will easily think of other embodiments of the present disclosure after considering the specification and practicing the content disclosed herein. This application is intended to cover any variations, uses, or adaptive changes of the present disclosure, which follow the general principles of the present disclosure and include common knowledge or conventional technical means in the technical field not disclosed in the present disclosure. The description and embodiments are only regarded as exemplary, and the true scope and spirit of the present disclosure are pointed out by the claims.

What is claimed is:

1. A display substrate, comprising:
a first electrode provided with a plurality of slits;
a first wire provided on a side of the first electrode, a first gap being provided between the first wire and the first electrode, and the first wire being electrically connected to the first electrode;
a second wire provided on a side of the first electrode away from the first wire, and a second gap being provided between the second wire and the first electrode;
wherein each of the slits is provided with a first end and a second end opposed to each other, and the first end is close to the first wire, and the second end is close to the second wire, and a light-transmitting part of the first end is larger than a light-transmitting part of the second end,
wherein each of the slits is formed by connecting a first side, a first side group, a second side and a second side group end to end, and the first side and the second side are parallel to each other, and the first side group is arranged at the first end, and the second side group is arranged at the second end,
wherein a shape formed by the first side group protrudes toward a side of the first wire, and a shape formed by the second side group protrudes toward a side of the second wire.

2. The display substrate of claim 1, wherein a number of sub-sides included in the first side group is greater than or equal to a number of sub-sides included in the second side group.

3. The display substrate of claim 2, wherein
the first side group comprises:
a first sub-side connected to the first side;
a second sub-side, one end of which is connected to the first sub-side and the other end of which is connected to the second side;
the second side group comprises:
a fourth sub-side connected to the second side;
a fifth sub-side, one end of which is connected to the fourth sub-side, and the other end of which is connected to the first side;
wherein the fourth sub-side is arranged in parallel with the first sub-side, a length of the fourth sub-side is less than a length of the first sub-side, and a length of the fifth sub-side is greater than a length of the second sub-side; or the fifth sub-side and the second sub-side are arranged in parallel, the length of the fifth sub-side is less than the length of the second sub-side, and the length of the fourth sub-side is greater than the length of the first sub-side.

4. The display substrate of claim 2, wherein
the first side group comprises:
a first sub-side connected to the first side; and
a second sub-side, one end of which is connected to the first sub-side and the other end of which is connected to the second side;
the second side group comprises:
a fourth sub-side connected to the second side; and
a fifth sub-side, one end of which is connected to the fourth sub-side, and the other end of which is connected to the first side;
wherein a length of the first sub-side is greater than a length of the fourth sub-side, and a length of the second sub-side is greater than a length of the fifth sub-side.

5. The display substrate of claim 2, wherein
the first side group comprises:
a first sub-side connected to the first side;
a second sub-side connected to the first sub-side; and
a third sub-side, one end of which is connected to the second sub-side, and the other end of which is connected to the second side;
the second side group comprises:
a fourth sub-side connected to the second side; and
a fifth sub-side, one end of which is connected to the fourth sub-side, and the other end of which is connected to the first side;
wherein an included angle between the first sub-side and the first side is greater than an included angle between the fourth sub-side and the second side, an included angle between the third sub-side and the second side is greater than an included angle between the fifth sub-side and the first side, and a perpendicular distance between at least one point on the second sub-side and a line connecting a first end of the first side and a first end of the second side is equal to a perpendicular distance between an intersection of the fourth sub-side and the fifth sub-side and a line connecting a second end of the first side and a second end of the second side.

6. The display substrate according to claim 1, wherein the first side group is configured as an arc, and the second side group comprises at least two sub-sides, and a radius of the arc is greater than or equal to a radius of a circumcircle of the second side group.

7. The display substrate according to claim 1, wherein in a first area of the first electrode, the slits extend in a first direction; and in a second area of the first electrode, the slits extend in a second direction, and the first direction is not parallel to the second direction.

8. The display substrate of claim 1, wherein the display substrate further comprises a second electrode, and the second electrode is arranged opposite to the first electrode to form a multi-dimensional electric field.

9. The display substrate of claim 8, wherein the first electrode is a pixel electrode, and the second electrode is a common electrode.

10. The display substrate of claim 9, wherein the display substrate further comprises:
a base substrate on which a plurality of sub-pixels are provided;
each of the sub-pixels comprising a thin film transistor, a gate line, and a common electrode line, the thin film transistor comprising a source, a drain, and a gate, the source and the drain being provided in the same layer and being made by the same material as the first wire, the source being electrically connected to the first wire, and the drain being electrically connected to the first electrode;
a gate line, which is provided in the same layer and is made by the same material as the gate, and is electrically connected to the gate; and
a common electrode line provided in the same layer and made by the same material as the gate, and the common electrode line being electrically connected to the second electrode.

11. A display panel, comprising the display substrate according to claim 1.

12. A display device, comprising the display panel of claim 11.

* * * * *